US007421780B2

(12) United States Patent
Houle et al.

(10) Patent No.: US 7,421,780 B2
(45) Date of Patent: Sep. 9, 2008

(54) METHODS FOR FABRICATING THERMAL MANAGEMENT SYSTEMS FOR MICRO-COMPONENTS

(75) Inventors: Sabina Houle, Phoenix, AZ (US); James C. Matayabas, Jr., Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 244 days.

(21) Appl. No.: 11/326,942

(22) Filed: Jan. 6, 2006

(65) Prior Publication Data

US 2006/0120048 A1    Jun. 8, 2006

Related U.S. Application Data

(62) Division of application No. 10/676,977, filed on Sep. 30, 2003, now Pat. No. 7,019,971.

(51) Int. Cl.
*H05K 3/30* (2006.01)
(52) U.S. Cl. .............................. 29/832; 29/843; 29/725; 29/890.03; 165/104.33; 257/712
(58) Field of Classification Search .................. 29/832, 29/834, 840, 843, 726, 890.03, 890.039; 156/251, 261; 165/7, 84.4, 104.33; 257/706, 257/707, 712, 719; 361/689, 717
See application file for complete search history.

(56) References Cited

U.S. PATENT DOCUMENTS

| 4,091,125 | A   | * | 5/1978  | Delgadillo ................. 427/98.5 |
| 5,294,831 | A   |   | 3/1994  | Azar et al. |
| 6,158,502 | A   | * | 12/2000 | Thomas ................. 165/104.26 |
| 6,317,326 | B1  | * | 11/2001 | Vogel et al. ................. 361/704 |
| 6,381,846 | B2  |   | 5/2002  | Insley et al. |
| 6,437,437 | B1  |   | 8/2002  | Zuo et al. |
| 6,457,515 | B1  |   | 10/2002 | Vafai et al. |
| 6,551,061 | B2  |   | 4/2003  | Darolia et al. |
| 6,989,134 | B2  | * | 1/2006  | Tonkovich et al. .......... 165/167 |

\* cited by examiner

*Primary Examiner*—Donghai D. Nguyen
(74) *Attorney, Agent, or Firm*—Schwabe, Williamson & Wyatt, P.C.

(57) ABSTRACT

Methods for fabricating thermal management systems for micro-component devices are described herein. The methods may include initially overlaying a target substrate with a blank that is in sheet form, and stamping a microchannel structure having a plurality of outer walls enclosing a predefined area from the blank. The microchannel structure may then be bonded to a heat dissipating side opposite from a micro-component device facing side of a first substrate, the micro-component device facing side of the first substrate being adapted to thermally engage with the micro-component device. The microchannel structure may then be bonded to a second substrate opposite the first substrate, resulting in a closed volume microchannel being defined. Finally, the defined microchannel may then be substantially filled with a fluid thermal interface material.

8 Claims, 9 Drawing Sheets

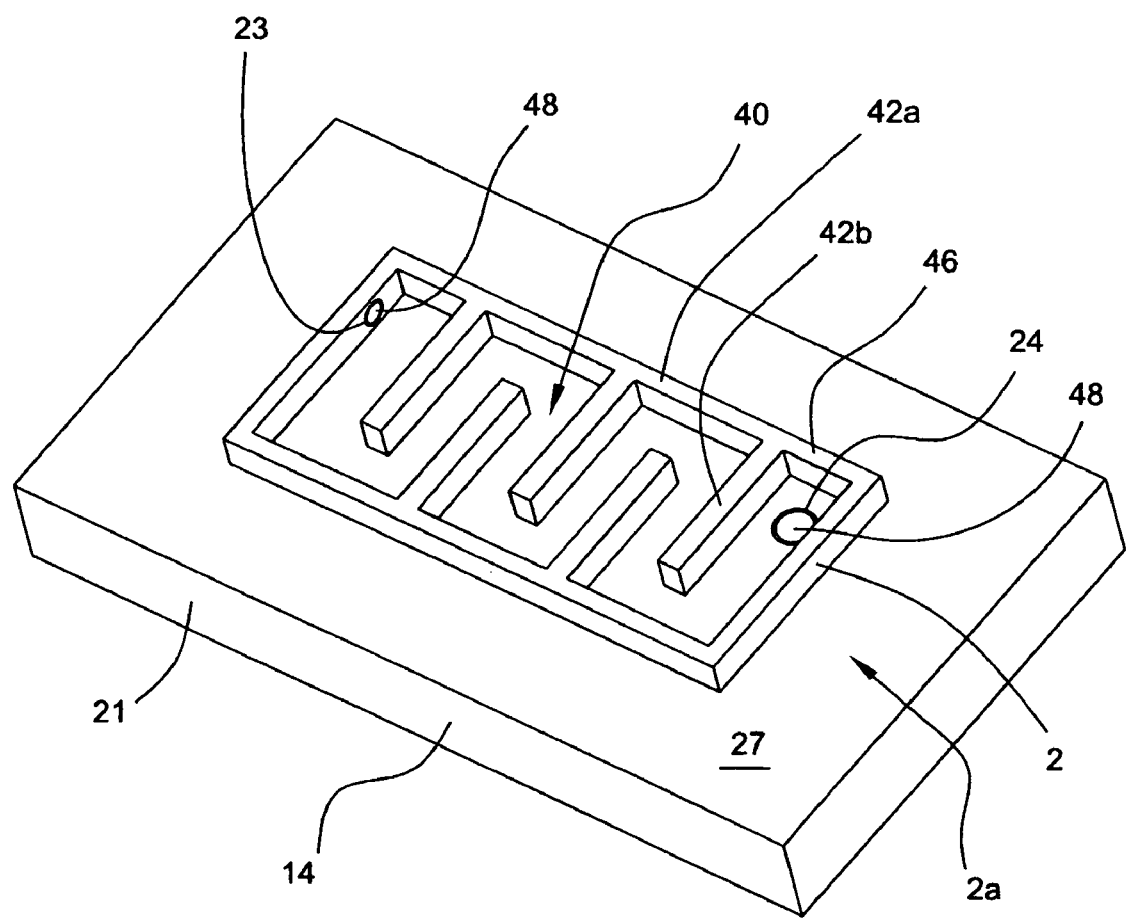

METHODS FOR FABRICATING THERMAL MANAGEMENT SYSTEMS FOR MICRO-COMPONENTS

RELATED APPLICATION

The present application is a divisional of U.S. patent application Ser. No. 10/676,977, filed Sep. 30, 2003, and entitled "THERMAL MANAGEMENT SYSTEMS FOR MICRO-COMPONENTS," now U.S. Pat. No. 7,019,971, which is hereby incorporated by reference in its entirety.

FIELD OF THE INVENTION

The present invention relates to thermal management of micro-components, and, more particularly, to methods and apparatus for thermal management of die and packaging using fluid thermal interface material.

BACKGROUND OF INVENTION

Micro-components, such as, but not limited to, microelectronic, micro-optoelectronic, and microelectromechanical systems (MEMS), share a common fabrication technology wherein a plurality of interconnected microcircuits are made within and upon a substrate. This substrate is commonly referred to as a die or microelectronic die. A microelectronic package, for example, comprises a microelectronic die electrically interconnected with a carrier substrate, and one or more other components, such as electrical interconnects, an integrated heat spreader, a heat sink, among others. An example of a microelectronic package is an integrated circuit microprocessor, wherein the microelectronic die comprises integrated circuits.

A die commonly comprises an active side having electrical interconnects and a die backside that provides a broad surface suitable for coupling with a heat dissipation device, also referred to as a thermal management system. A die generates heat as a result of the electrical activity of the internal microcircuits. In order to minimize the damaging effects of this heat, passive and/or active thermal management systems are used to dissipate the heat. Such thermal management systems include heat sinks, heat spreaders, and fans, among many others and combinations, that are adapted to thermally couple with the die backside. There are limitations in the use of each type of thermal management system, and in many cases, the thermal management system is designed specifically for a particular die, package design and/or intended operation, limiting cross-platform compatibility.

Integrated heat spreaders (IHS) are passive thermal conducting lids or caps placed in thermal engagement with the die backside. Integrated heat spreaders comprise a housing having a broad flat top and perimeter sides defining a cavity. The IHS is placed over the die with the die contained within the cavity, with the inside surface of the top in thermal engagement with the die backside. The free edges of the perimeter sides provide an interface for which to bond the IHS to the carrier substrate. The IHS provides a sealed housing protecting the die, as well as an enlarged planar top surface for thermally coupling with another component of a thermal management system, such as a heat sink.

A heat sink provides a large thermal mass with a large surface area relative to the backside of the die. The heat sink is coupled in thermal engagement with the die backside, commonly by way of an IHS as an interface, for conducting heat from the die to the heat sink. The heat sink provides an enlarged surface area, primarily by way of a plurality of appendages, commonly fins or pins, to convectively transfer heat to the surrounding environment. Heat sinks tend to be very large and have sophisticated design with regards to the appendages. In some cases, a fan is coupled to the heat sink to further enhance convective heat transfer to the environment.

A heat sink is commonly coupled to an IHS with a thermal interface material (TIM), such as a grease having a relatively high thermal conductivity, between the opposing surfaces of the heat sink and IHS. The TIM accommodates for any surface irregularities to ensure that the opposing surfaces are in full thermal engagement. The TIM, therefore, reduces the thermal resistance at the interface between the IHS and the heat sink. The heat sink is commonly secured to the IHS with a hold-down clip or other retention mechanism.

Non-uniform power distribution across the die results in localized high heat flux areas, referred to as hot spots, on the die backside. The thermal management system must be able to maintain these high heat flux areas at or below a specified temperature. This is very difficult when the heat flux of the high heat flux areas can be 10-times the average across the die backside. Current thermal management systems are limited in their ability to mitigate these high heat flux areas.

The IHS does not have a major effect on distributing the heat evenly across the die backside. An uneven heat distribution across the die backside causes a number of issues. For example, the thermal management system must be sized to manage the highest expected temperature associated with the high heat flux areas. Further, the temperature difference across the die can cause mechanical stresses at the electrical interconnects due to uneven thermal expansion. Also, the internal microcircuits operate more efficiently when at a uniform operating temperature.

One major factor contributing to the limitations of current thermal management systems is the relatively high thermal resistance between the IHS and the heat sink. The thermal resistance at the interface with the available TIM is not low enough to adequately provide the necessary thermal mitigation in a reasonably sized system. Issues of excessive thermal management system size, weight, complexity, and cost become driving factors in new microelectronic package design.

Active cooling technology utilizing fluid to assist in the transport of heat away from the die has been attempted and shows great promise. Such systems currently require complex fabrication techniques that are difficult to incorporate into the existing microelectronic package fabrication and assembly line, as well as being cost prohibitive.

BRIEF DESCRIPTION OF DRAWINGS

FIGS. 3A and 3B are top perspective views of a microchannel structure comprising a microchannel defined by a plurality of microchannel walls surrounded by an edge seal;

DESCRIPTION

In the following detailed description, reference is made to the accompanying drawings which form a part hereof wherein like numerals designate like parts throughout, and in which is shown by way of illustration specific embodiments in which the invention may be practiced. It is to be understood that other embodiments may be utilized and structural or logical changes may be made without departing from the scope of the present invention. Therefore, the following detailed description is not to be taken in a limiting sense, and the scope of the present invention is defined by the appended claims and their equivalents.

The present invention is directed towards embodiments of methods and apparatus for the fabrication and utilization of a fluid-assisted thermal management system suitable for microelectronic packaging. The methods utilize low temperature processes, including, but not limited to, cold forming and diffusion bonding, to provide a microchannel structure through which a fluid thermal interface material (TIM) is contained and/or circulated. In the description to follow, embodiments of the present invention provide the microchannel structure located at the interface between an integrated heat spreader (IHS) and a heat sink, providing a microthermofluidic device for thermal management of the microelectronic package, and specifically, the die. It is understood that the various embodiments are provided as examples for practicing the present invention, but are not intended to limit the present invention thereto, and that the methods can be utilized to form a microchannel structure at other locations on or about the microelectronic package or on other micro-components requiring thermal management.

Figure 1:
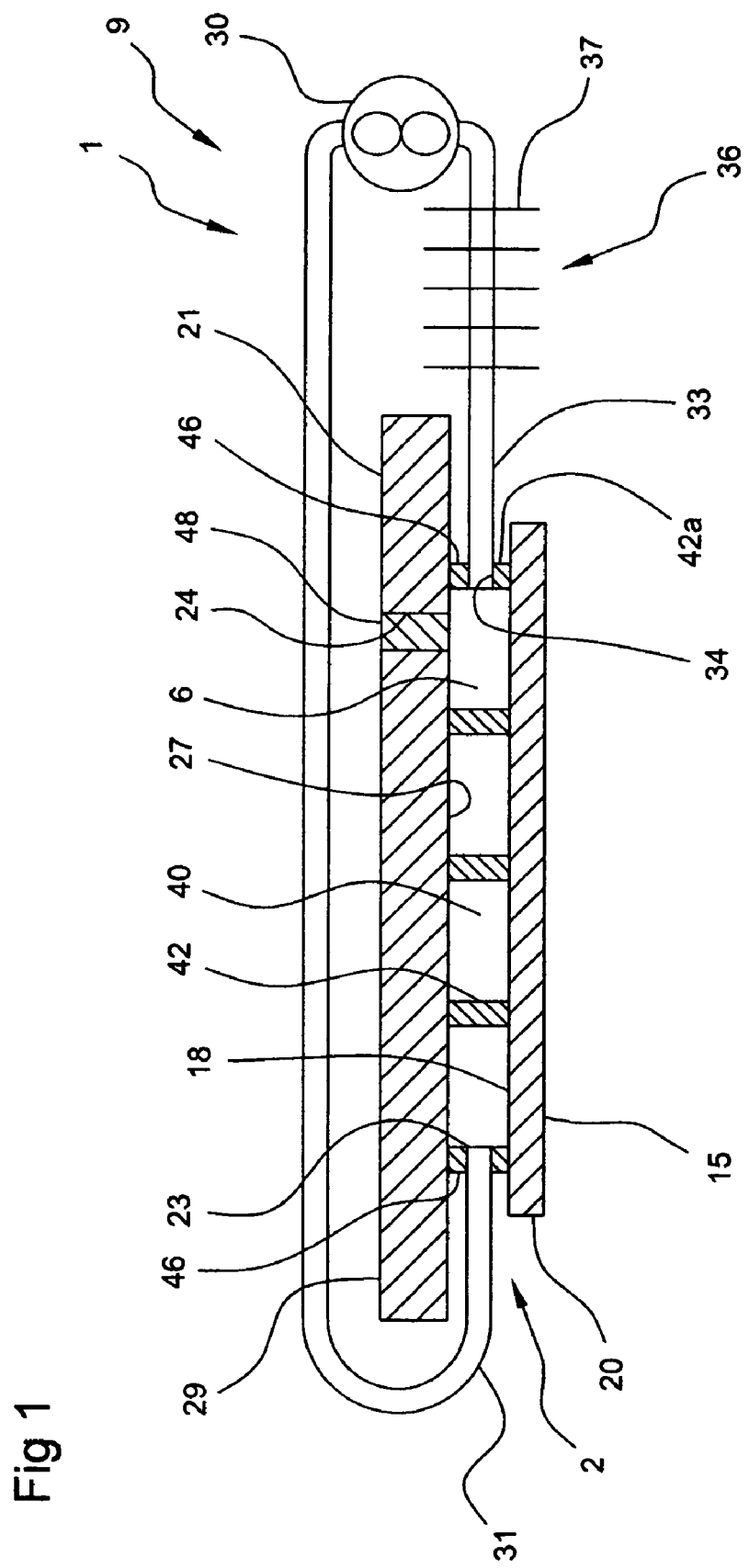
FIG. 1 is a cross-sectional view of an embodiment of a thermal management system, in accordance with an embodiment of the present invention.

FIG. 1 is a cross-sectional view of an embodiment of a thermal management system 1, in accordance with an embodiment of the present invention. The thermal management system 1 comprises a first substrate 20, a second substrate 21, and a microchannel structure 2 there between containing a fluid TIM 6. In another embodiment, the thermal management system 1 further comprises a fluid TIM 6 circulating apparatus 9.

Figure 2:
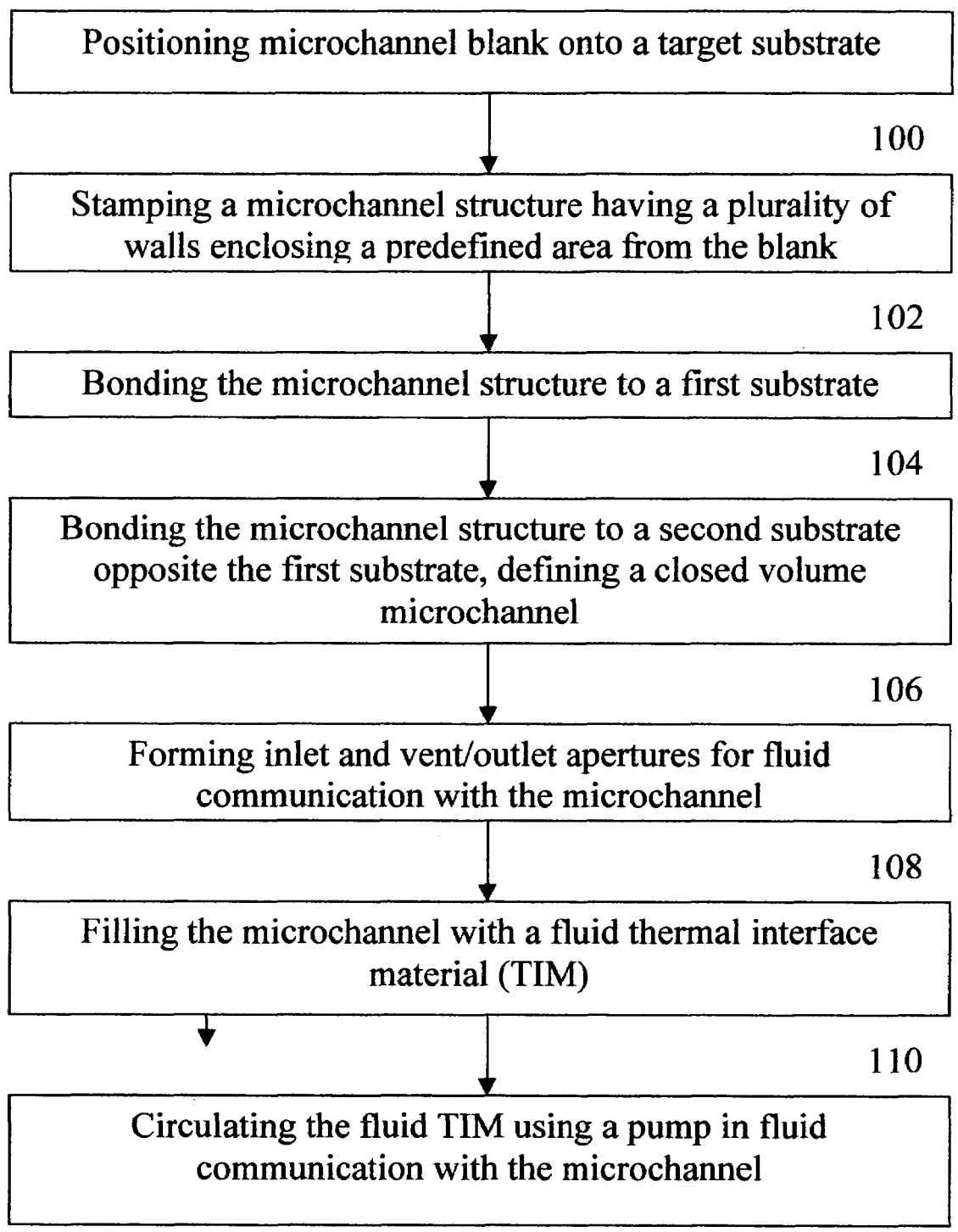
FIG. 2 is a flow diagram of embodiments of methods for fabricating a thermal management system, in accordance with the present invention.

FIG. 2 is a flow diagram of an embodiment of a method for fabricating a thermal management system, in accordance with the present invention. A blank comprising a material suitable for the particular purpose in the form of a sheet is positioned onto a substrate 100. A microchannel structure having a plurality of walls enclosing a predefined area is press-cut from the blank using a press tool having raised cutting edges 102. The microchannel structure is bonded to a first substrate 104. The microchannel structure is bonded to a second substrate opposite the first substrate, enclosing a predefined volume defining a microchannel 106. An inlet and outlet aperture are provided for access to the microchannel 108. The microchannel is filled with a fluid thermal interface material (TIM) 110. In another embodiment, a pump is provided in fluid communication with the microchannel to circulate the fluid TIM 112.

Referring again to FIG. 1, the first substrate 20 comprises a first heat dissipating side 18 and a die-facing side 15 that is adapted for thermal coupling with a die. The second substrate 21 comprises a microchannel-facing side 27 and a second heat dissipation side 29 that is adapted for thermal coupling with the environment and/or heat exchange apparatus and the like. The first and second substrates 20,21 comprise a material having a relatively high thermal conductivity, such as, but not limited to, AlSiC, Cu, and Ni-plated copper.

FIG. 3A is a top perspective view of a microchannel structure 2 comprising a plurality of outer walls 42a defining an edge seal 46. The edge seal 46 is coupled in fluid-tight engagement between the first heat dissipating side 18 and the microchannel-facing side 27. The edge seal 46 encloses a predetermined area, and, in combination with the first substrate 20 and the second substrate 21, defines a microchannel 40 therein. The microchannel 40 is adapted to contain therein and/or permit the flow of fluid TIM 6 there through. The fluid TIM 6 is supplied to and/or drained from the microchannel 40 in any number of ways, including one or more edge seal apertures 23 and/or one or more substrate apertures 24, as will be described below.

In another embodiment in accordance with the present invention, in addition to the outer walls 42a, the microchannel structure 2 comprises one or more inner walls 42b in fluid-tight engagement with the first heat dissipating side 18 and microchannel-facing side 27. The fluid TIM 6 is contained and/or constrained to follow the microchannel 40 along the path defined by the inner walls 42b and the outer walls 42a.

The microchannel structure 2 is fabricated in accordance with various embodiments of methods in accordance with the present invention. The microchannel structure 2 has a predetermined height such that the first and second substrates 20,21 are spaced a predetermined distance apart. This height defines, in part, the volume of the microchannel 40.

In one embodiment of methods in accordance with the present invention, the microchannel structure 2 is fabricated from a material blank formed directly onto a target surface, such as the microchannel-facing side 27, the first heat dissipating side 18, or other surface. In yet another embodiment, the microchannel structure 2 is fabricated onto a transfer sheet for subsequent placement and bonding between the microchannel-facing side 27 and first heat dissipating side 18.

Figure 4:
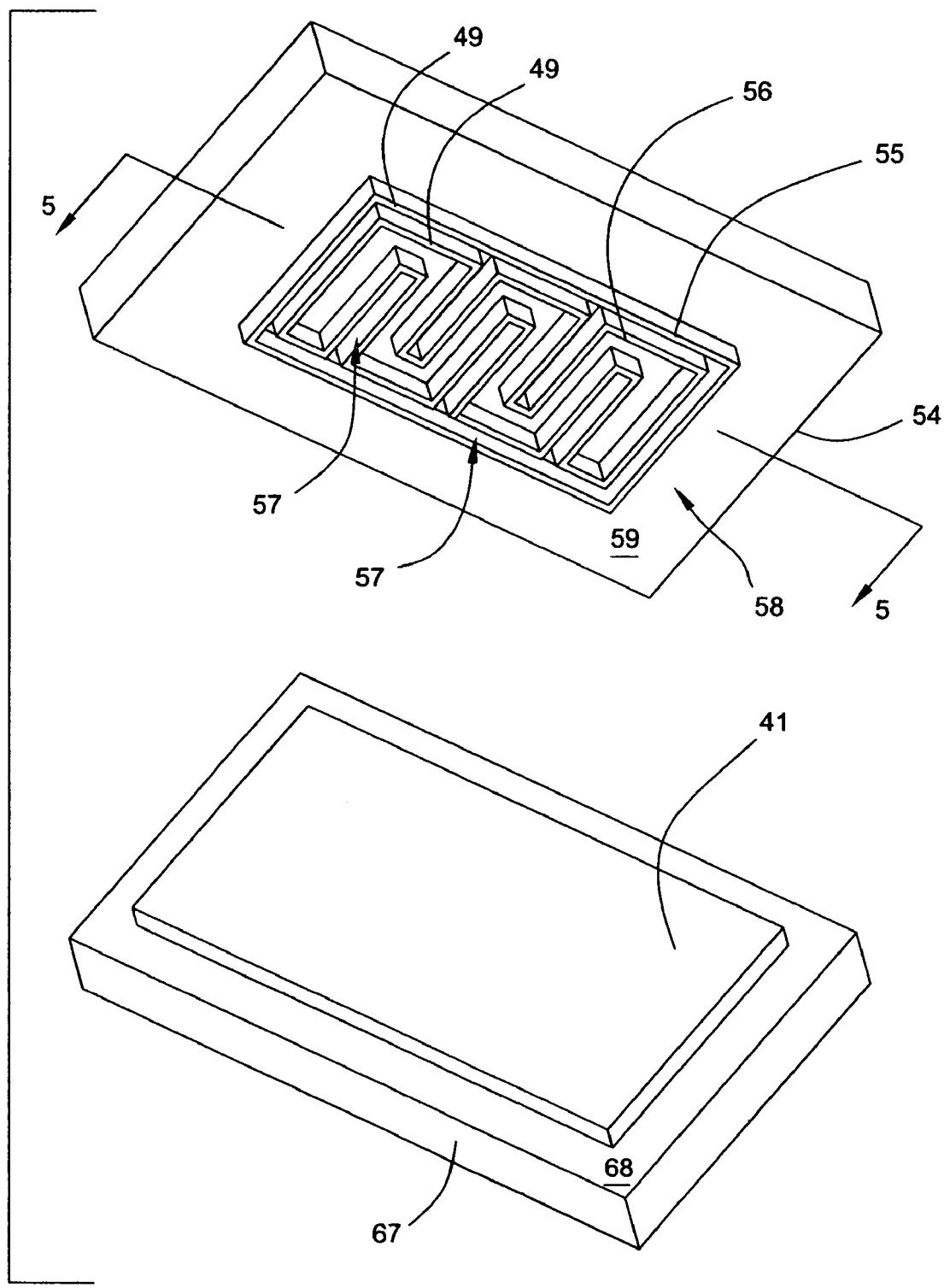
FIG. 4 is a perspective exploded view of apparatus suitable for the fabrication of the microchannel structure, in accordance with one embodiment of the method of the present invention.

FIG. 4 is a perspective exploded view of apparatus suitable for the fabrication of the microchannel structure 2, in accordance with an embodiment of the method of the present invention. A blank 41, comprising a suitable material in the form of roll stock or sheet, is placed on a target side 68 of a target substrate 67, such as, but not limited to, the microchannel-facing side 27 of the second substrate 21, and the first heat dissipation side 18 of the first substrate 20, among others. A press tool 54 is provided with a predetermined relief structure 58 extending from a tool surface 59, comprising an outer blade structure 55 and an inner blade structure 56. The outer blade structure 55 and an inner blade structure 56 are configured in a complimentary cookie-cutter form suitable for a particular purpose. The outer blade structure 55 and inner blade structure 56 each terminate at a cutting edge 49.

A suitable apparatus, such as, but not limited to, an opposing platen press (not shown), is used such that the relief structure 58 of the press tool 54 is caused to be pressed into the blank 41. The blank 41 is caused to be stamped or cut-out, in cookie-cutter fashion, under the pressure of the relief structure 58 of the press tool 54 cutting through the blank 41 to the target surface 68. Upon withdrawal of the press tool 54, portions of the blank 41 are removed leaving the target surface 68 provided with the remaining portions of the blank 41 in the form of the microchannel structure 2.

In one embodiment in accordance with the present invention, the press tool 54, and in particular the relief structure 58, is provided with a coating, such as, but not limited to, electrolytic Ni plating, which for some blank 41 materials, provides advantages, such as, but not limited to, a cleaner cut, reduced press tool 54 wear, and/or reduced adhesion of the blank 41 to the press tool 54.

A fluid-tight bond between the microchannel structure 2 and both the microchannel-facing side 27 and the first heat dissipating side 18 is produced using various embodiments of methods of the present invention. These methods include, but are not limited to, diffusion bonding techniques.

Diffusion bonding techniques are known in the metallurgical arts and comprise the manipulation of various predetermined parameters, including, but not limited to, combinations of materials, pressure, temperature, and/or time, among others. Diffusion bonding produces an intermolecular bond that can be tailored to produce a bond suitable for the intended purpose. The diffusion bonding process is conducted at any of a number of stages of fabrication, such as, but not limited to, during the operation wherein the press tool 54 applies a compressive force during the stamping operation, in a process in which the first heat dissipating side 18 and the microchannel-facing side 27 are simultaneously bonded to the microchannel structure 2 under a compressive force, and/or during a reflow process in the course of subsequent microelectronic packaging processes.

Figure 5:
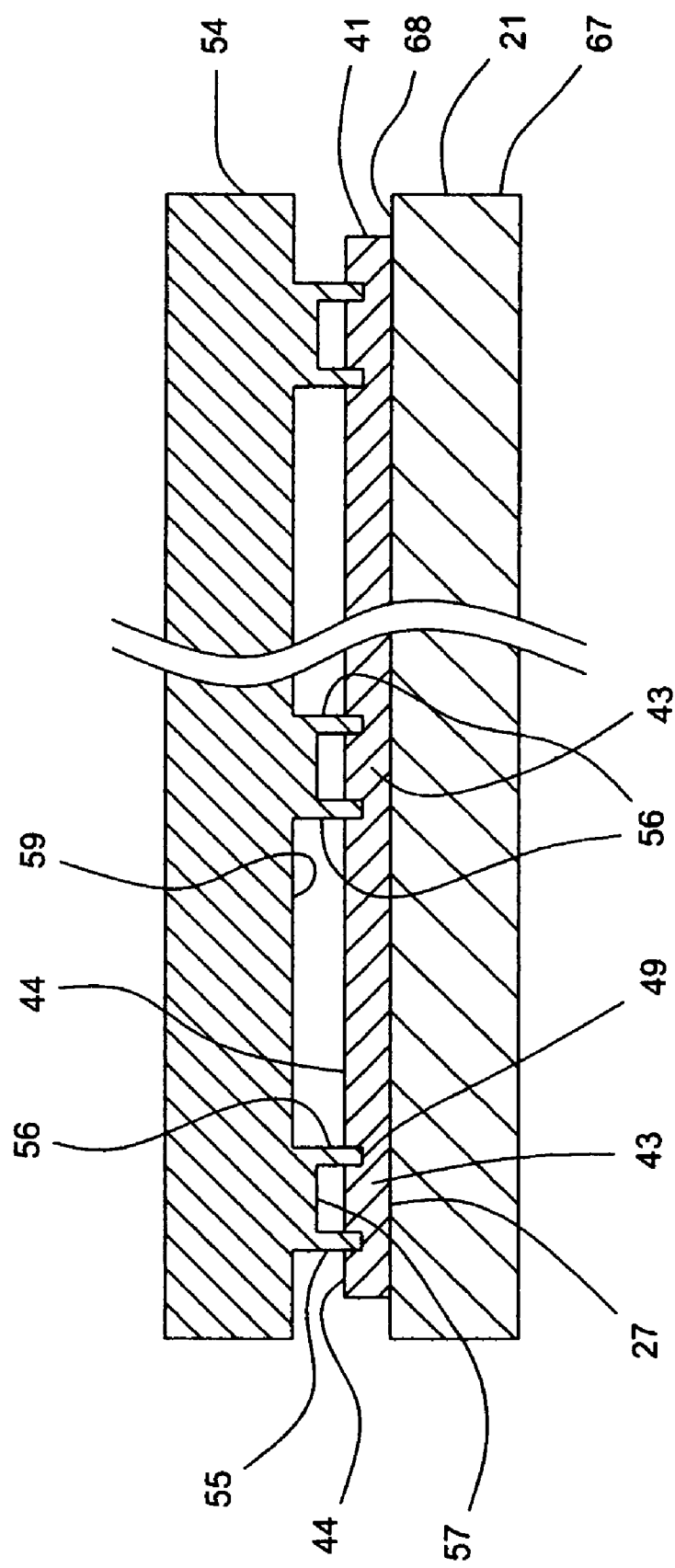
FIG. 5 is a cross-sectional view of a blank on the microchannel-facing side partially stamped by the press tool adapted to apply compressive force during the stamping operation, in accordance with an embodiment of the present invention.

FIG. 5 is a cross-sectional view, along section 5-5 as shown in FIG. 4, of the press tool 54 adapted for stamping and diffusion bonding the microchannel structure 2 to the target surface 68, in accordance with embodiments of apparatus and methods of the present invention. The relief structure 58 further comprises an inner surface 57 within the channel defined by either adjacent portions of the inner blade structure 56 or as adjacent portions of the inner and outer blade structures 56,55. The inner surface 57 is adapted to apply a compressive force onto a microchannel structure portion 43 of the blank 41 that will become the microchannel structure 2.

Wherein the microchannel structure 2 is stamped and diffusion bonded by the press tool 54, the target surface 68 of the target substrate 67 comprises either the microchannel-facing side 27 of the second substrate 21 or the first heat dissipating side 18 of the first substrate 20. In an embodiment of the present invention, the first substrate 20 is the IHS 14 and the second substrate 21 is the heat sink 25.

FIG. 5 shows the blank 41 in the process of being stamped and subsequently diffusion bonded to the target surface 68. A compressive force on the microchannel structure portion 43 is provided wherein the inner surface 57 is a predetermined distance from the cutting edge 49 of the outer or inner blade structure 55,56 that is less than the thickness of the blank 41. The inner surface 57, therefore, bottoms out and urges against the microchannel structure portion 43 during the stamping operation, providing compression and intimate contact between the microchannel structure portion 43 and target surface 68, in combination with other parameters, to effect a diffusion bond.

The tool surface 59 is a predetermined distance from the cutting edge 49 that is greater than the thickness of the blank 41. Therefore, during the stamping and diffusion bonding of the microchannel structure portion 43, remaining portions 44 of the blank 41 are not subjected to compression and are not diffusion bonded to the target surface 68. The remaining portions 44 are subsequently removed.

In yet another embodiment in accordance with the present invention, the press tool 54 and/or the target substrate 67 is heated to a predetermined elevated temperature. An elevated temperature below the melt temperature of the blank 41 accelerates the diffusion bonding process between the microchannel structure portion 43 and the target surface 68.

Figure 6:
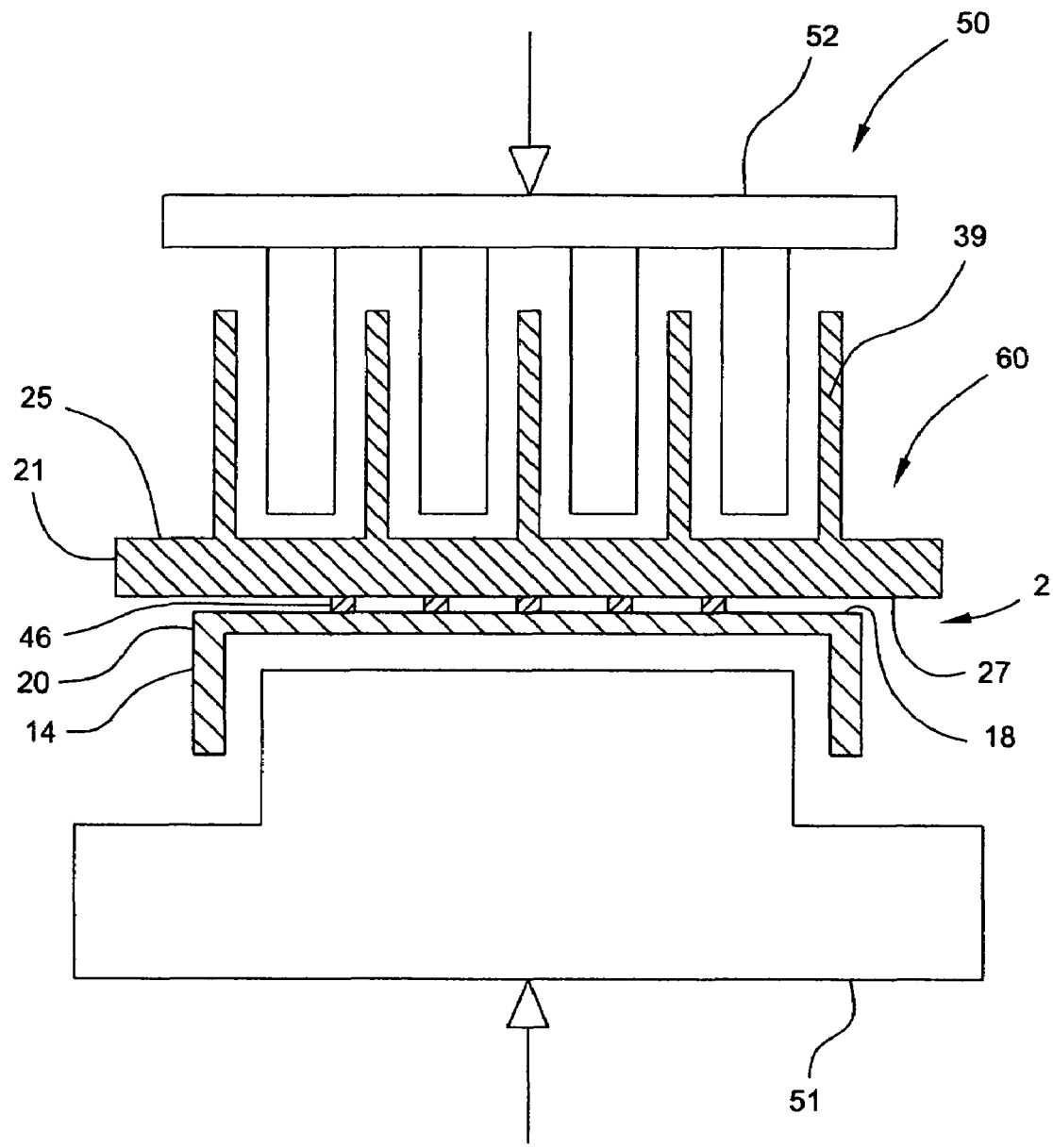
FIG. 6 is a cross-sectional view of an IHS, a heat sink, and the microchannel structure, as positioned in a bonding press apparatus, in accordance with an embodiment of a method of the present invention.

FIG. 6 is a cross-sectional view of the first substrate 20 in the form of an IHS 14, the second substrate 21 in the form of a heat sink 25, and the microchannel structure 2 there between, as positioned in a bonding press apparatus 50, in accordance with an embodiment of the present invention. The bonding press apparatus 50 comprises a first platen 51 and a second platen 52 upon which the IHS 14 and the heat sink 25, respectively, are placed. The first and second platens 51,52 are in opposing relationship and adapted to apply a compressive force therebetween.

In embodiments wherein the microchannel structure 2 is previously bonded to one of either the heat sink 25 or the IHS 14, such as in a process as described above, a bond between the unbonded components is required. Compressive force between the first and second platens 51,52 provides intimate contact between the unbonded components. A diffusion bonding process, such as described above, is provided by the bonding press apparatus 50 and effects a suitable diffusion bond between the unbonded components.

In yet another embodiment in accordance with the present invention, the first and/or second platens 51,52 are heated to a predetermined elevated temperature. An elevated temperature below the melt temperature of the microchannel structure 2 accelerates the diffusion bonding process between the microchannel structure 2 and the unbonded component.

Referring again to FIG. 4, in another embodiment in accordance with the present invention, the target substrate 67 comprises a transfer sheet. The microchannel structure 2 is formed on the transfer sheet by the press tool 54, and subsequently removed from the transfer sheet and placed between the first and second substrates 20 and 21, such as the IHS 14 and the heat sink 25 shown in FIG. 6. In similar arrangement as discussed above, the compressive force of the first and second platens 51,52 provides intimate contact between the microchannel structure 2 and both the heat sink 25 and the IHS 14. A diffusion bonding process, such as described above, is thus provided by the bonding press apparatus 50 and effects a suitable diffusion bond between the microchannel structure 2 and both the heat sink 25 and the IHS 14.

The diffusion bonding process bonds the first and second substrates 20, 21, such as the IHS 14 and the heat sink 25, to the microchannel structure 2 there between, into a strong, void-free, fluid-tight bond. Material selection at the interface between the components is predetermined to effect a quality diffusion bond. Improper material selection and/or predetermined bonding parameters can cause brittle intermetalics to grow at the diffusion layer resulting in unsatisfactory bonds.

In one embodiment in accordance with the present invention, the microchannel structure 2 comprises Indium (In) solder which diffusion bonds, under predetermined conditions, to Ni-plated and Ag-plated copper in a strong bond that is free of brittle intermetalics. The thermal conductivity of In solder is approximately 80 W/mK, which is significantly higher than that of many passive TIM materials, making In solder, among other materials, a desirable microchannel structure 2 material.

The microchannel structure 2 remains in solid form, that is, below the melt temperature, during diffusion bonding as well as under normal operating conditions of the microelectronic package. Therefore, the microchannel structure 2 will remain substantially in the as-stamped dimensions. The dimensional stability provided by diffusion bonding processes provides for the fabrication of microchannel structures 2 in micro scale feature sizes, for example, but not limited to of 25 to 1000 um.

Referring again to FIG. 6, the embodiments of the methods as described above provide a thermal management system 60 wherein the heat sink 25 and IHS 14 are bonded to the microchannel structure 2 there between, prior to the coupling of the IHS 14 with the die and carrier substrate. In this way, functional tests can be made on the thermal management system 60 to ensure proper function and that no leakage or blockage is present prior to coupling with a die. Prior assembly also protects the other micro-components from possible heat and compressive forces during the diffusion bonding process.

A fluid TIM 6 is introduced into the microchannel 40 using various methods depending, in part, on whether the fluid will be static or flowing. Referring again to FIGS. 1 and 3A, in accordance with an embodiment of the present invention, fluid TIM 6 is introduced into the microchannel 40 through an inlet aperture 23 provided in the edge seal 46. A vent aperture 24 is provided through the second substrate 21 in fluid communication with the microchannel 40. The vent aperture 24 is provided for, among other things, to allow the escape of gas from within the microchannel 40 during fluid TIM 6 filling and/or to provide a fluid outlet in a circulating system. An outlet aperture 34 is provided through the edge seal 46 to provide a fluid outlet for the fluid TIM 6 in a circulating system, as an alternative to using a vent aperture 24 for the fluid outlet. It is recognized that one or more inlet, vent and/or outlet apertures 23, 24, 34 may be provided in the edge seal 46 and/or the second substrate 21.

In accordance with an embodiment of the present invention, the fluid TIM 6 is static within the microchannel 40, with no corresponding fluid TIM 6 circulation. The static fluid TIM 6 provides a conduit for thermal transfer between the first and second substrates 20,21. The fluid TIM 6 is introduced into the microchannel 40 through the inlet aperture 23 displacing gas out of the vent aperture 24. Upon the filling of the microchannel 40, the vent aperture 24 is provided with a plug 48 to contain the TIM 6 within the microchannel 40. The plug 48 comprises a material, such as, but not limited to, epoxy, silicone, urethane, other polymers, and solder.

In another embodiment in accordance with the present invention, the vent aperture 24 is provided with a plug 48 comprising a gas-permeable material that provides for the purging of gas but containment of the higher viscosity fluid TIM 6. Such gas-permeable material is known in the art, including, but not limited to, gas-permeable membrane and porous metal.

In accordance with another embodiment of the present invention, the fluid TIM 6 is circulated through the microchannel 40, providing a conduit for thermal conduction between the first and second substrates 20,21, as well as, providing a conduit for thermal dissipation through an external heat exchange apparatus.

Referring again to FIG. 1, the fluid TIM 6 is driven by a pressure differential to provide a flow of fluid TIM 6 from the inlet aperture 23, through the microchannel 40, and exiting the vent aperture 24 or the outlet aperture 34. The fluid TIM 6 is driven by an external fluid micropump 30 in fluid communication with the microchannel 40 via a supply line 31 coupled to the inlet aperture 23, and a drain line 33 coupled to the outlet aperture 34. The vent aperture 24 allows for the venting and purging of gas by the fluid TIM 6 and is provided with a plug 48.

The micropump 30 is selected from a number of types of micropumps suitable for the particular purpose, such as, but not limited to, mechanical and piezoelectric micropumps. A pressure differential, and therefore fluid flow, is produced by the micropump 30 to circulate the fluid TIM 6 through a circuit comprising the supply line 31, the microchannel 40, the drain-line 33, the micropump 30 and back again to the supply line 31.

The fluid TIM 6 is predetermined to have the ability to rapidly absorb and dissipate thermal energy. A number of materials are suitable for the particular purpose, such as, but not limited to, solders that are liquid at room temperature, such as, but not limited to, Indalloy® 51 Ga—In—Sn Alloy, Cesium Francium, and Rubidium. Other suitable materials (including their melt temperature), include, but are not limited to: Indalloy® 51 Ga—In—Sn Alloy (11 C), Indalloy® 60 Ga—In Alloy (16 C), Francium, Fr (27 C), Cesium, Cs (28 C), Gallium, Ga 30, Rubidium, Rb (39 C), Indalloy® 117 Bi—Pb—In—Sn—Cd Fusible Alloy (47 C), Indalloy® 136 Bi—In—Pb—Sn Fusible Alloy (58 C), Indalloy® 19 In—Bi—Sn Fusible Alloy (60 C), Indalloy® 158 Bi—Pb—Sn—Cd Solder Alloy (70 C), Indalloy® 162 In—Bi Fusible Alloy (72 C), Indalloy® 174 Bi—In—Sn Fusible Alloy (79 C), Indalloy® 8 In—Sn—Cd Fusible Alloy (93 C), and Indalloy® 42 Bi—Sn—Pb Solder Alloy (96 C).

Figure 7:
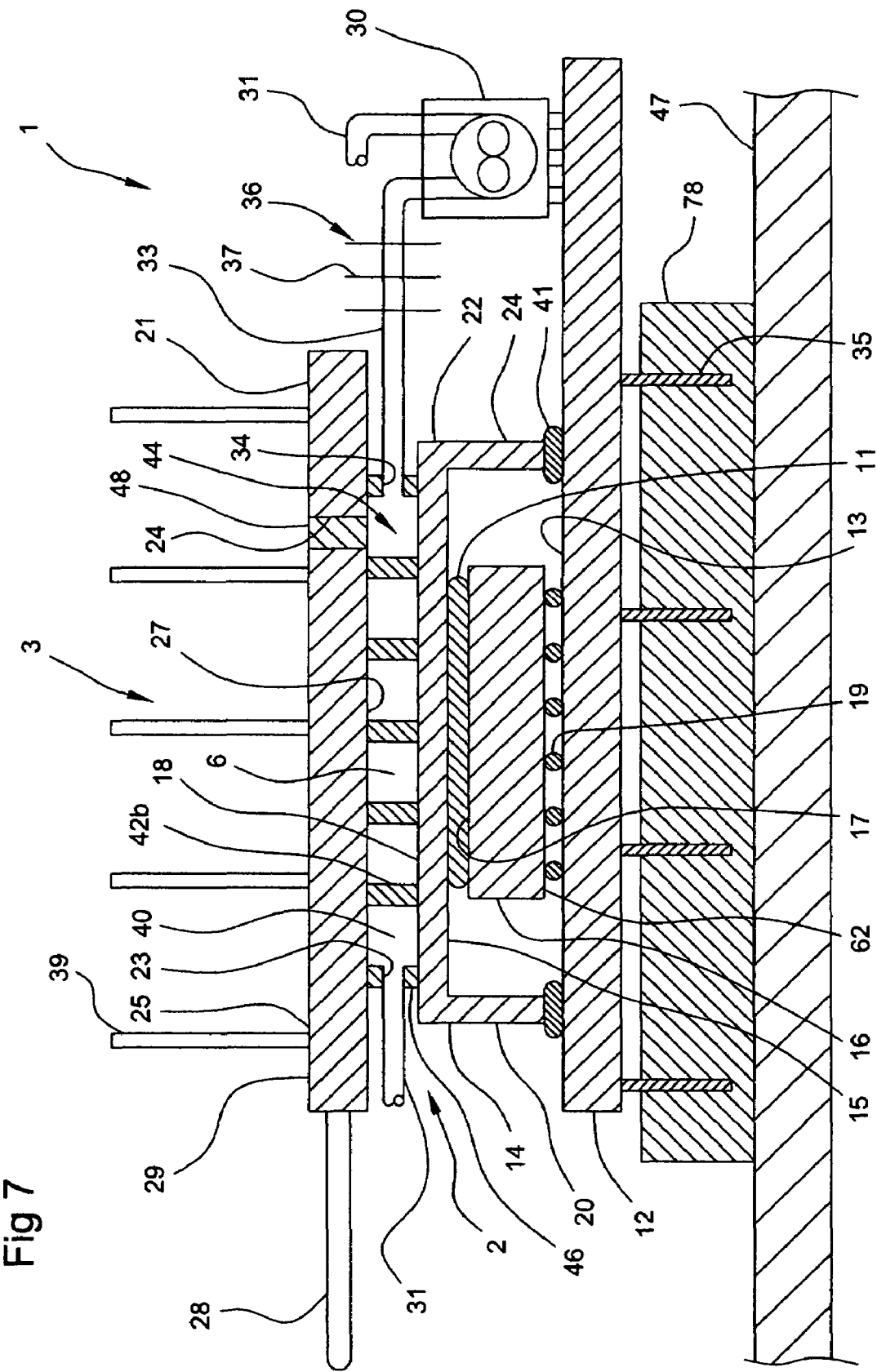
FIG. 7 is a cross-sectional view of an embodiment of an actively cooled micro-component package, in accordance with an embodiment of the present invention.
Figure 8:
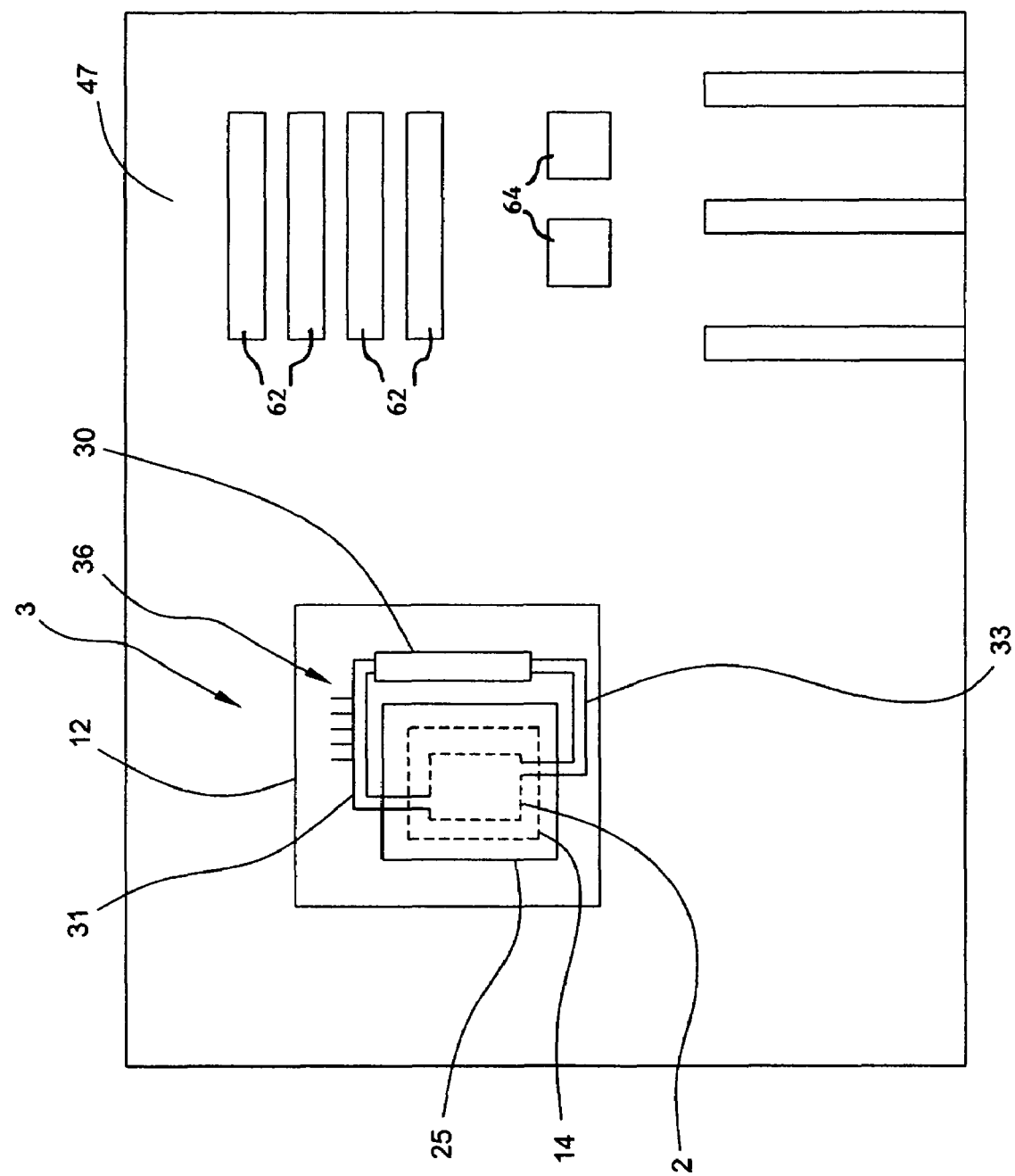
FIG. 8 is a top view of an embodiment of an actively cooled micro-component package, in accordance with an embodiment of the present invention.

FIGS. 7 and 8 are a side cross-sectional view and a top view of an embodiment of a microelectronic package 3 comprising a thermal management system 1, in accordance with an embodiment of the present invention. The microelectronic package 3 is coupled to a socket 78 with pins 35 on a system substrate 47, such as, but not limited to, a mother board of a personal computer.

In various embodiments, system substrate 47 may also includes a number of expansion slots 62 and various other embodiments 64. Examples of expansion slots 62 may include but not limited Peripheral Control Interface (PCI) expansion slots or Industry Standard Architecture (ISA) slots. Examples of other components 64 may include but are not limited to Dynamic Random Access Memory (DRAM), Flash Memory, Digital Signal Processors (DSP), Graphics Processors, Math co-processors, Video Encoder/Decoder, and so forth.

The thermal management system 1 is substantially as provided by the embodiment of FIG. 1, wherein the first substrate 20 comprises an integrated heat spreader (IHS) 14, and the second substrate 21 comprises a heat sink 25, and a microchannel structure 2 there between. The microelectronic package 3 further comprises a die 16 having a die backside 17 and an active side 62, illustrated as a flip-chip, but not limited thereto, and electrical interconnect material 19 electrically interconnecting the die 16 with a carrier substrate die-facing side 13 of a carrier substrate 12.

The IHS 14 comprises a top portion 22 and side portions 24. The top portion 22 comprises a die-facing side 15 adapted for thermal coupling with the die backside 17. The top part 22 also comprises a first heat dissipating side 18 for thermal engagement with the microchannel structure 2 and the fluid TIM 6 therein. The side portions 24 are adapted to extend from the top portion 22 to the carrier substrate die-facing side 13 and coupled thereto, with an attachment material 41, such as, but not limited to, adhesive and solder.

The heat sink 25 comprises a microchannel-facing side 27 and a second heat dissipating side 29, and heat dissipation appendages 39. The IHS 14 and heat sink 25 are comprised of a material having a relatively high thermal conductivity, such as, but not limited to, AlSiC, Au-plated Cu, and Ni-plated copper.

The microchannel structure 2 is bonded to the microchannel-facing side 27 and first heat dissipating side 18, as provided by embodiments of methods of the present invention previously described.

When electrically active, thermal energy from the die 16 is conducted to the die backside 17 where it is conducted to the IHS 14 through a first stage thermal interface material 11. In embodiments wherein the fluid TIM 6 is a static system, thermal energy is conducted from the IHS 14 through the first heat dissipating side 18 and to at least two thermal paths: through the microchannel structure 2 to the heat sink 25 and through the fluid TIM 6 to the heat sink 25.

In embodiments wherein the fluid TIM 6 is provided in a circulating apparatus 9 in association with an external system, the thermal energy is conducted from the IHS 14 through the first heat dissipating side 18 and to at least three thermal paths: through the microchannel structure 2 to the heat sink 25; through the fluid TIM 6 to the heat sink 25; and to the fluid TIM 6 to the external system.

In accordance with an embodiment of the present invention, a thermal management system 3 comprises a micropump 30, a supply line 31 coupled to the inlet aperture 23, and a drain line 33 coupled to the outlet aperture 34. In an embodiment in accordance with the present invention, the drain line 33 is provided with a heat exchanger 36 wherein thermal energy absorbed by the fluid TIM 6 is conducted, at least in part, to the heat exchanger 36 for heat transfer to the environment via the heat dissipation fins 37.

In another embodiment in accordance with the present invention, the heat sink 25 further comprises one or more extended heat pipes 28 and/or heat sink appendages 39. The heat pipes 28 and/or heat sink appendages 39 transfer thermal energy from the heat sink 25 to the environment and/or to another heat exchange component.

In another embodiment in accordance with the present invention, an external chamber (not shown) is provided outside of the microchannel structure 2 and in fluid communication with the fluid TIM 6. The external chamber is adapted to have an internal volume to contain fluid TIM 6 and provide an additional mechanism, such as an increased volume and therefore thermal mass of fluid TIM 6, to effect greater thermal management.

Referring again to FIG. 3A, the location of the microchannel 40 about the microchannel-facing side 27, and thus the first heat dissipating side 18, is predetermined considering one or more criteria, some of which include, but are not limited to, expected magnitude of heat flux, distribution of heat flux, and environmental considerations. The configuration of the microchannel structure 2a shown in FIG. 3A, provides a generally uniform flow pattern defined by substantially equally spaced microchannel walls 42 in a serpentine pattern. This flow pattern may be considered for applications, such as, but not limited to, where the heat flux from the die backside 17 that is conducted to the IHS 14 is substantially uniform across the first heat dissipation side 18 and/or where the flow rate of the fluid TIM 6 is sufficiently high to make further change in the flow pattern unnecessary.

Figure 3B:
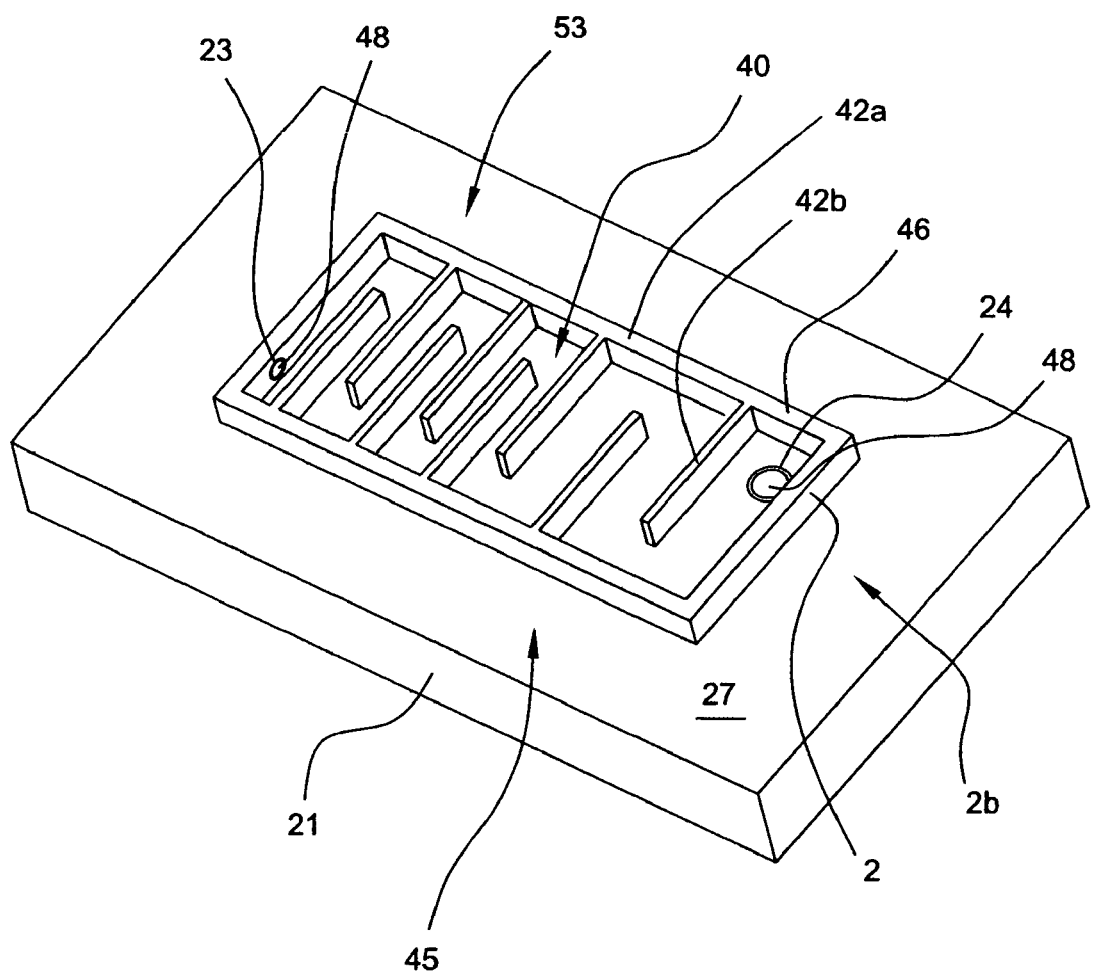

FIG. 3B is a top perspective view of a non-uniform microchannel structure 2b, in accordance with an embodiment of the present invention. The microchannel structure 2b comprises a plurality of microchannel walls 42 spaced strategically defining a microchannel 40 positioned strategically on the first heat dissipating side 18 corresponding to predetermined variations of heat flux across the die backside 17 conducted by the IHS 14. The microchannel walls 42 are positioned and configured in cooperative relationship with the variations of heat flux to reduce the peak temperature of the die 16 and/or to reduce the temperature gradient across the die 16.

The specific arrangement of the microchannel walls 42 will determine the degree of thermal transport away from the die 16 by the fluid TIM 6 in the microchannel 40. For example, an area on the die 16 comprising high power density floating point integrated circuits is a potential high heat flux area, whereas the area comprising low power density cache memory integrated circuits is a potential low heat flux area. The efficiency and capacity of the thermal management system 1 is dependent on one or more factors, such as, but not limited to, the flow rate and volume of the fluid TIM 6 at specific locations over time, which is dependent on factors such as, but not limited to, the spacing, distribution and volumetric capacity defined by the microchannel walls 42. The microchannel walls 42 define a flow pattern to have in a complementary relationship between the first area 53 and a second area 45 and the integrated circuit design of the die 16 to result in a predetermined rate of heat removal in the high heat flux area and the low heat flux area, and therefore provide efficient thermal management for heat removal and/or distribution.

It is appreciated that various combinations of microchannel 40 size, flow path, rate of flow, among others, provide various thermal management opportunities. In other embodiments in accordance with the present invention, the microchannel walls 42 define a pattern of multiple microchannels 40 in parallel relationship to provide a predetermined thermal transport condition.

In accordance with embodiments of the present invention, fluid TIM 6 improves the structural and electrical performance of the microelectronic package 3 by managing the thermal condition of the die 16. Management of hot spots has the effect of reducing the die 16 peak and average temperature. The benefits of reducing thermal gradients and lowering die 16 operating temperature, include improving the thermo-mechanical performance of the microelectronic package 3, such as, but not limited to, preventing interconnect material 19 failure between the die 16 and the carrier substrate 12, an issue found in passive thermal management systems.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. A method for fabricating a thermal management system for a micro-component device, comprising:
   overlaying a target substrate as a first substrate with a blank in sheet form;
   providing a press tool having a predetermined relief structure with cutting blades for cutting the blank, the relief structure having an inner surface between adjacent cutting blades;
   stamping a microchannel structure having a plurality of outer walls enclosing a predefined area from the blank and defining an edge seal enclosing a predetermined area of the target substrate, comprises: pressing the press tool into the blank such that the cutting blades cut through the blank to the target substrate, cutting the blank into the microchannel structure and waste portions, and the inner surface of the release structure applying a predetermined compressive force onto the microchannel structure to facilitate a fluid-tight diffusion bond between the microchannel structure and the target substrate;

removing the waste portions;

bonding the microchannel structure to a heat dissipating side opposite from a micro-component device facing side of the first substrate, the micro-component device facing side for thermally engaging with the micro-component device;

bonding the microchannel structure to a second substrate opposite the first substrate, defining a closed volume microchannel; and substantially filling the microchannel with a fluid thermal interface material.

2. The method of claim 1, wherein applying a compressive force between the target substrate and the microchannel structure to effect a fluid-tight diffusion bond between the target substrate and the microchannel structure comprises:

applying a compressive force at an elevated temperature below the melt temperature of either the target substrate and the microchannel structure over a predetermined period of time to effect a fluid-tight diffusion bond between the target substrate and the microchannel structure.

3. The method of claim 1, wherein bonding the microchannel structure to a second substrate opposite the first substrate, defining a closed volume microchannel comprises:

providing a second substrate onto the microchannel structure opposite the target substrate; and applying a predetermined compressive force to the second substrate and microchannel structure sufficient to provide a fluid-tight diffusion bond there between.

4. The method of claim 3, wherein applying a predetermined compressive force to the second substrate and microchannel structure sufficient to provide a fluid-tight bond there between comprises:

applying a predetermined compressive force at an elevated temperature below the melt temperature of either the target substrate, second substrate, and the microchannel structure, over a predetermined period of time to effect a fluid-tight diffusion bond between the second substrate and the microchannel structure.

5. The method of claim 3, wherein substantially filling the microchannel with a fluid thermal interface material comprises:

substantially filling the microchannel with an indium alloy that is liquid at a predetermined micro-component device operating temperature.

6. The method of claim 3, further comprising thermally coupling the micro-component device facing side of the first substrate with a heat-producing side of the micro-component device.

7. The method of claim 6, wherein thermally coupling the micro-component device facing side of the first substrate with a heat-producing side of the micro-component device comprises:

thermally coupling the micro-component device facing side of the first substrate with a backside of a microelectronic die, the microelectronic die comprising integrated circuits.

8. The method of claim 7, further comprising: thermally coupling the fluid thermal interconnect material with one or more thermal dissipation devices selected from the group consisting of heat pipe, thermal dissipation fins, fan, heat exchanger, and flat plate.

* * * * *

UNITED STATES PATENT AND TRADEMARK OFFICE
CERTIFICATE OF CORRECTION

PATENT NO. : 7,421,780 B2  Page 1 of 1
APPLICATION NO. : 11/326942
DATED : September 9, 2008
INVENTOR(S) : Houle et al.

It is certified that error appears in the above-identified patent and that said Letters Patent is hereby corrected as shown below:

Column 11
Line 37, "...there between." should read --...therebetween.--.

Column 12
Lines 3-4, "...there between." should read --...therebetween.--.
Line 12, "The method of claim 3,..." should read --The method of claim 1, ...--.
Line 18, "The method of claim 3,..." should read --The method of claim 1, ...--.

Signed and Sealed this

Ninth Day of February, 2010

David J. Kappos
*Director of the United States Patent and Trademark Office*